United States Patent
Cholasta

(10) Patent No.: US 10,396,785 B2
(45) Date of Patent: Aug. 27, 2019

(54) REDUCTION OF CAPACITIVE TOUCH SENSE ELECTRODE SAMPLE VALUE CHANGE WHEN ELECTRODE SCAN PERIOD IS CHANGED

(71) Applicant: NXP USA, Inc., Austin, TX (US)

(72) Inventor: Petr Cholasta, Hutisko-Solanec (CZ)

(73) Assignee: NXP USA, Inc., Austin, TX (US)

(*) Notice: Subject to any disclaimer, the term of this patent is extended or adjusted under 35 U.S.C. 154(b) by 0 days.

(21) Appl. No.: 15/839,155

(22) Filed: Dec. 12, 2017

(65) Prior Publication Data

US 2019/0181860 A1 Jun. 13, 2019

(51) Int. Cl.
  *H03K 17/96* (2006.01)
  *G06F 3/044* (2006.01)

(52) U.S. Cl.
  CPC ......... *H03K 17/9622* (2013.01); *G06F 3/044* (2013.01); *G06F 2203/04112* (2013.01); *H03K 17/962* (2013.01); *H03K 2017/9602* (2013.01); *H03K 2217/9607* (2013.01); *H03K 2217/96071* (2013.01); *H03K 2217/960735* (2013.01)

(58) Field of Classification Search
  CPC ...... H03M 11/00; H03M 11/02; H03M 11/20; G06F 3/023; G06F 3/03; G06F 3/044; G06F 2203/04112; H03K 2217/0027; H03K 2217/94073; H03K 2217/9607; H03K 2217/960715; H03K 2217/960735; H03K 2217/960745; H03K 2217/96072; H03K 17/962; H03K 17/9622; H03K 17/9625; H03K 2017/9602; H03K 2217/960705; H03K 2217/96071; H03K 2217/96074
  See application file for complete search history.

(56) References Cited

U.S. PATENT DOCUMENTS

| | | | |
|---|---|---|---|
| 8,310,381 B2* | 11/2012 | Lin | G06F 3/044 178/18.06 |
| 9,292,125 B2* | 3/2016 | Kim | G06F 3/0416 |
| 2011/0109585 A1 | 5/2011 | Kwon et al. | |
| 2013/0265276 A1* | 10/2013 | Obeidat | G06F 3/044 345/174 |
| 2014/0062945 A1 | 3/2014 | Monson | |
| 2015/0292933 A1* | 10/2015 | Wiggli | G01F 23/263 |
| 2016/0011692 A1* | 1/2016 | Heim | G06F 3/017 345/174 |
| 2017/0281014 A1* | 10/2017 | von Luehmann | A61B 5/4064 |
| 2017/0322674 A1* | 11/2017 | Rosenberg | G06F 3/03545 |

* cited by examiner

*Primary Examiner* — Franklin D Balseca

(57) ABSTRACT

A touch sensitive capacitive keypad system (100) is provided with an analog-to-digital converter, a keypad sensing electrode (114) coupled to measure capacitance voltages using a configurable electrode scan rate, and a controller (120) configured to provide scan-rate independent capacitance voltage measurements from the keypad sensing electrode to the analog-to-digital converter when there is a change in the configurable electrode scan rate by repetitively sampling a capacitance voltage measurements (e.g., 524a-f) from the keypad sensing electrode over a plurality of sequential electrode scan cycles and then discarding a predetermined number of the capacitance voltage measurements (e.g., 524a-b) to generate the scan-rate independent capacitance voltage measurements (e.g., 524c-f) that are provided to the analog-to-digital converter.

18 Claims, 6 Drawing Sheets

REDUCTION OF CAPACITIVE TOUCH SENSE ELECTRODE SAMPLE VALUE CHANGE WHEN ELECTRODE SCAN PERIOD IS CHANGED

BACKGROUND OF THE INVENTION

Field of the Invention

The present invention is directed in general to field of capacitive sensor devices. In one aspect, the present invention relates to a method, apparatus and system for sensing touch and release at a capacitive touch sense electrode.

Description of the Related Art

Capacitive sensor devices are useful in a variety of different applications to capture user input from detected proximity, touch or release events in a variety of electronic devices (e.g., cellular telephones, appliances, industrial equipment, MP3 players, personal digital assistants (PDAs), tablet computers and other similar portable electronic devices) and automotive applications (e.g., car steering wheel control buttons, HVAC control panel, overhead console, etc.). In capacitive touch sensor devices (e.g., buttons, keyboards, sliders, steering wheel hands-off-detection, etc.) which use one or more sampling capacitors in connection with an analog-to-digital converter (ADC) to detect capacitive touch or release events, there can be manufacturing process variations in the formation of the capacitor(s) that cannot be precisely controlled, introducing inaccuracies into the performance of the capacitive touch sensor device. There can also be performance errors introduced when the capacitive touch sensor device changes the electrode scan period or rate, such as when the scan rate is increased to achieve faster reaction time of following touch event detection, or decreasing the scan rate when an electrode is released so as to enter a low power mode. When there are electrode scan rate variations, the electrode and/or converted ADC output values can vary as well, leading to situations where the identical electrode capacitance is represented by two different voltages or ADC output values, depending on electrode scan rate. Existing solutions to address such errors require calculation of electrode value compensation offsets in which complex software calculations assign each electrode a compensation value (offset) when changing the electrode scan period to compensate the electrode and/or $C_{EXT}$ ADC converted voltage change. As the sampled value varies with environment parameters (e.g., temperature), the compensation offsets need to be changed with environment parameters as well, requiring periodic re-calibrations that increase computational complexity and power consumption. As seen from the foregoing, the existing capacitive sensor solutions are extremely difficult at a practical level by virtue of the difficulty in accurately and efficiently capturing keypad inputs, especially in operating conditions where changing electrode scan rates can introduce measurement inaccuracies that can impose complex compensation value offset computations.

BRIEF DESCRIPTION OF THE DRAWINGS

The present invention may be understood, and its numerous objects, features and advantages obtained, when the following detailed description of a preferred embodiment is considered in conjunction with the following drawings.

DETAILED DESCRIPTION

An apparatus, system, and methodology are described for providing a capacitive keypad with improved performance by selectively using repetitive electrode value samples with settled values when electrode sampling rate changes occur to accurately detect keypad electrode touch and release events, thereby improving sense accuracy and reducing the cost and complexity requirements for computing compensation offsets when electrode scan rates change. In selected example embodiments, a capacitive sensor device redistributes an initial charge collected at an external capacitor (Cext) across an external sensing electrode or capacitor (Cs) until the voltage is equalized between the two capacitors, allowing the sensor voltage on the external sensing electrode/capacitor to be converted from the analog to digital domain by an analog-to-digital converter (ADC). When sampling rate for the ADC changes, the voltage at the external sensing electrode/capacitor (Cs) and/or the resulting digitized ADC output can also change, meaning that the identical electrode capacitance is represented by two different voltages, depending on electrode scan period. To prevent the digitized ADC output from being processed to falsely detect a touch or release event when electrode scan period is changed, multiple scan samples from the sense capacitor/electrode are collected during each scan cycle ($T_{SC}$), and then one or more of the first samples are discarded so that only the samples with settled values are used as sensor voltage inputs from the external sensing electrode/capacitor electrode to the ADC voltage for further processing. In this way, voltage samples from the external sensing electrode/capacitor electrode are obtained independently of the electrode scan rate.

Figure 1:
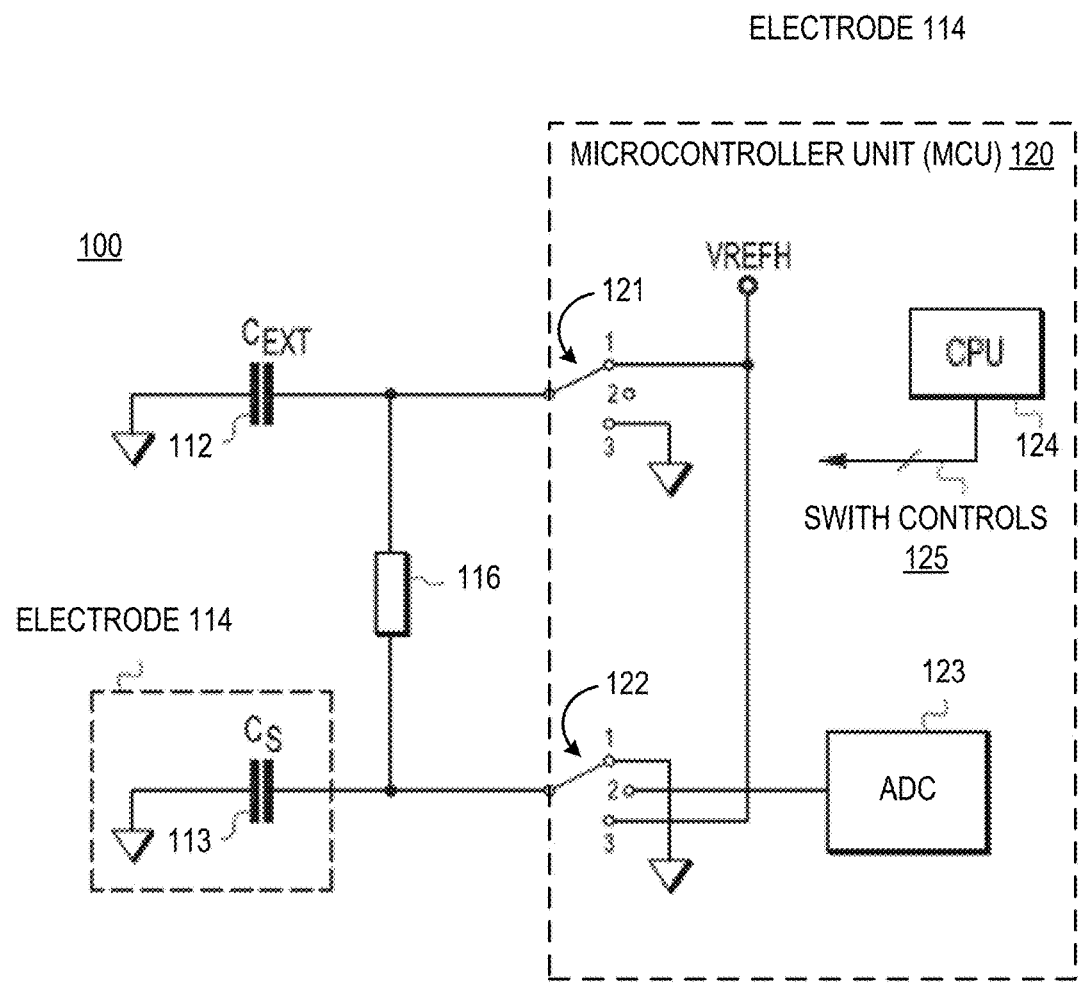
FIG. 1 depicts a simplified circuit schematic diagram of a capacitive sensor device with various switch configurations in accordance with selected embodiments of the present disclosure.

To provide additional details for an improved understanding of selected embodiments of the present disclosure, reference is now made to FIG. 1 which is a simplified circuit schematic diagram of a capacitive sensor device 100 with various switch configurations in accordance with selected embodiments of the present disclosure. The depicted device 100 includes an external capacitor (Cext) 112, an electrode 114 (also referred to as a sense electrode) which includes a sensing capacitor (Cs) 113, a resistive or switching element 116, and a microcontroller unit (MCU) 120 which includes a first switch 121, a second switch 122, an ADC 123, and an a central processing unit (CPU) 124 which controls operation of MCU 120. Though not shown, it will be appreciated that the ADC 123 may be considered external to MCU 120 or, alternatively, may be considered a part of device 100. Device 100 includes a first supply voltage terminal connected to supply a first or high reference supply voltage (VREFH) and a second supply voltage terminal connected to a second or low reference supply voltage (ground).

With a first electrode of the external capacitor Cext 112 coupled to the second supply voltage terminal and a second electrode of the external capacitor Cext 112 coupled to a first terminal of resistive or switching element 116 and to a first terminal of the first switch 121, the external capacitor Cext 112 is connected to be alternately switched between the high reference supply voltage (VREFH), an open position, and the low reference supply voltage (ground). To this end, a second terminal of the first switch 121 is coupled to the first supply voltage terminal, a third terminal of the first switch 121 is coupled to an open circuit, and a fourth terminal of the first switch 121 is coupled to the second supply voltage terminal. Depending on the control input to the first switch 121, one of three different positions can be achieved, with a first position connecting the first and second terminals of switch 121, with a second position connecting the first and third terminals of switch 121, and with a third position connecting the first and fourth terminals of switch 121.

In similar fashion, a first electrode of the external sensing capacitor Cs 113 in electrode 114 is coupled to the low reference supply voltage (ground) while the electrode 114 (and a second electrode of external sensing capacitor Cs 113) is coupled to a second terminal of resistive or switching element 116 and a first terminal of second switch 122 which connects the external sensing capacitor Cs 113 to be alternately switched between the low reference supply voltage (ground), the ADC 123, and the high reference supply voltage (VREF). In selected embodiments, the electrode 114 may have only one terminal (corresponding to the second electrode of external sensing capacitor Cs 113) in which case the first electrode of external sensing capacitor Cs 113 is a virtual terminal linked to the second supply voltage terminal. To this end, a second terminal of switch 122 is coupled to the second supply voltage terminal, a third terminal of switch 122 is coupled to a ADC 123, and a fourth terminal of switch 122 is coupled to the first supply voltage terminal. Depending on the control input to switch 122, one of three different positions can be achieved, with a first position connecting the first and second terminals of switch 122, with a second position connecting the first and third terminals of switch 122, and with a third position connecting the first and fourth terminals of switch 122. Thus, the numbers "1", "2", and "3" on switches 121 and 122 refer to the first, second and third positions of the switch and not the switch terminal.

Though not explicitly shown, it will be appreciated that the CPU 124 generates the switch control input signals 125 for switches 121 and 122 so as to place each switch in respective first, second, and third positions. For example, by switching the switches 121, 122 in a first position for a first mode, the external capacitor Cext 112 is coupled by switch 121 to VREFH to thereby charge the external capacitor Cext 112 while the external sensing capacitor Cs 113 is coupled by switch 122 to ground, thus discharging the external sensing capacitor Cs 113.

Once the external capacitor Cext 112 is charged and the external sensing capacitor Cs 113 is discharged, the switches 121, 122 are simultaneously switched to a second position for a second mode in which the switch 121 connects the second terminal of the external capacitor Cext 112 to an open circuit and switch 122 connects electrode 114 to the high impedance input of ADC 123. With this configuration, the charge on the external capacitor Cext 112 is distributed between the external capacitors 112 and 113 via resistive or switching element 116. In selected embodiments, the external capacitor Cext 112 may be selected so that it is equal in capacitance to the external sensing capacitor Cs 113 so that, after the charge distribution, the voltage over each capacitor is equal. Also, in this second mode, conversion of the voltage on the external sensing capacitor Cs 113 (the sense voltage at the second electrode of Cs 113) from an analog signal to a digital signal is performed by ADC 123 for further processing. The digital signal ADC output can be used, for example, to detect a touch or proximity on electrode 114. For example, when a touch event occurs, the capacitance on the external sensing capacitor Cs 113 increases, which causes the sense voltage at the input of ADC 123 to decrease. When a release of the touch occurs, the capacitance on the external sensing capacitor Cs 113 decreases, which causes the sense voltage at the input of ADC 123 to increase. Therefore, the digital output of ADC 123 can be used to detect a touch or release of touch event, or indicate a degree of proximity of a touch event.

Once the external capacitor Cext 112 is discharged and the external sensing capacitor Cs 113 is charged, the switches 121, 122 may be simultaneously switched to a third position for a third mode in which the switch 121 connects the second terminal of the external capacitor Cext 112 to the second supply voltage terminal and the switch 122 connects electrode 114 to the first supply voltage terminal. Once the external capacitor Cext 112 is discharged and the external sensing capacitor Cs 113 is charged, switches 121 and 122 can be placed in their respective second positions so as to enter the second mode, as described above. Thus returning to the second mode, the charge over the external sensing capacitor Cs 113 is distributed between the external sensing capacitor Cs 113 and external capacitor Cext 112 via resistive/switching element 116 which equalizes the voltages on the capacitors, and the conversion by ADC 123 begins. In this embodiment, when a touch event occurs, sense voltage at the input of ADC 123 increases, and when a release of the touch occurs, the sense voltage at the input of ADC 123 decreases.

Figure 2:
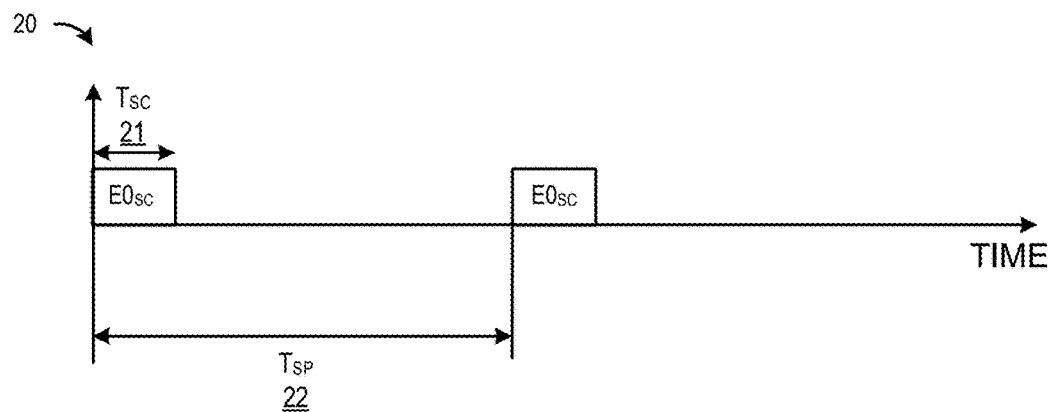
FIG. 2 depicts a simplified timing diagram of a first scan mode for a single capacitive touch keypad electrode which is scanned at a first scanning rate that periodically applies a sequence of sensing cycles to measure the key electrode in accordance with selected embodiments of the present disclosure.

To provide additional details for an improved understanding of selected embodiments of the present disclosure, reference is now made to FIG. 2 which depicts a first timing diagram 20 for a first scan mode of a single capacitive touch keypad electrode which is scanned with a first scanning rate by periodically applying a sequence of sensing cycles (e.g., $E0_{S1}$-$E0_{S6}$) to measure the key electrode E0 with each sensing cycle 21 having a sense duration $T_{SC}$ at a first periodic scanning interval $T_{SP}$ 22. In particular, the keypad electrode E0 is periodically scanned by applying a sequence of sensing cycles (e.g., $E0_{S1}$-$E0_{S6}$) within each scan cycle $E0_{SC}$ that is repeated with the electrode scan period $T_{SP}$ 22 which sets the scan rate for the keypad electrode E0. As will be appreciated, the electrode scan period $T_{SP}$ value can change over time for a variety of different reasons.

For example, when the electrode E0 is not touched, a first, relatively low frequency scan rate may be applied by setting the electrode scan period value $T_{SP}$ 22 to a first value (e.g., $T_{SP}$=50 ms), thereby setting the capacitive touch keypad in a low power or sleep mode during which baseline reference voltage measurements are collected from the keypad electrode. By collecting the baseline reference voltage measurements over time, the capacitive touch keypad performance may be adjusted continuously to the environment by using the baseline reference voltage measurements to auto-calibrate to external conditions. As a result, the performance of the keypad sensor is less affected by conditions that can impair or prevent correct functions in other devices.

Figure 3:
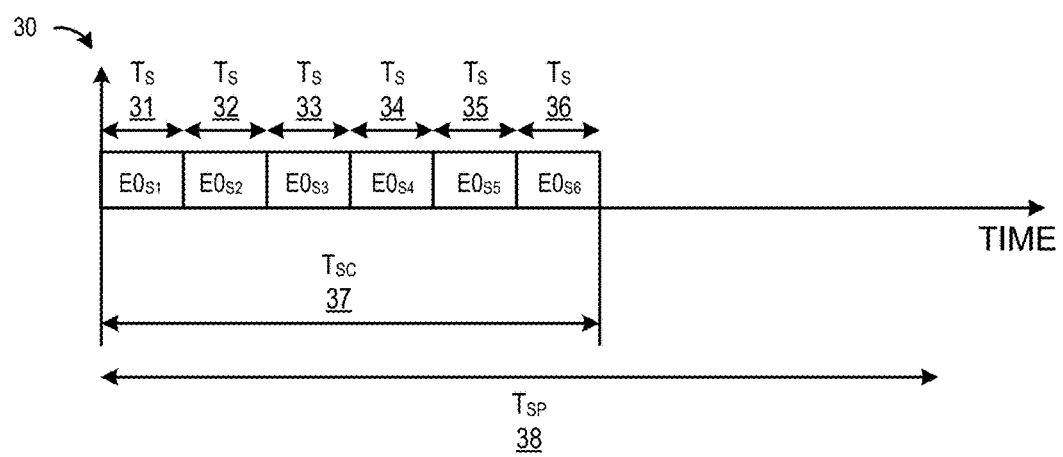
FIG. 3 depicts a timing diagram for a second scan mode for a single capacitive touch keypad electrode which is scanned at a second, faster scanning rate that periodically applies a sequence of sensing cycles to measure the key electrode in accordance with selected embodiments of the present disclosure.

As disclosed herein, the keypad electrode can be periodically scanned at a different scan rate for any of a variety of reasons, such as detecting an electrode touch, improving system EMI, or detecting object proximity to the keypad electrode. For example, when an electrode touch detected, a second, relatively fast frequency scan rate may be applied by setting the electrode scan period value $T_{SP}$ to a second, smaller value (e.g., $T_{SP}$=1 ms) so that the sequence of sensing cycles are periodically applied more frequently to sequentially measure the key electrode E0. In FIG. 3, this is illustrated with the second timing diagram 30 for a second scan mode of the capacitive touch keypad electrode E0 which is scanned with a faster scanning rate by sequentially applying the sequence of sensing cycles 31-36 (e.g., $E0_{S1}$-$E0_{S6}$) to measure the key electrode E0. Though not drawn to scale, the combined sensing cycles 31-36 form a sensing cycle 37 that has a sense duration $T_{SC}$ 37 and that is applied using a second periodic scanning interval $T_{SP}$ 38 which is shorter than first periodic scanning interval $T_{SP}$ 22. As will be appreciated, the scanning rate increase that occurs when the electrode scan period $T_{SP}$ 38 is reduced may be accompanied by changes in the electrode E0 sample value $T_S$ as well. In the second scan mode, the sensing cycles $E0_{S1}$-$E0_{S6}$ 31-36 are repeated at a periodic scanning interval $T_{SP}$ 38 until a release event is detected, at which time the capacitive touch keypad reverts back to the first scan mode (e.g., the low power or sleep mode).

With the example in FIG. 3, the sensing cycles 31-36 (e.g., $E0_{S1}$-$E0_{S6}$) are applied to obtain multiple (e.g., 6) samples of the key electrode E0 at the higher sampling rate $T_{SP}$ 38. However, the initial scan sample values (e.g., $E0_{S1}$ and $E0_{S2}$) can be changed or distorted since they are influenced by the changed electrode scan period $T_{SP}$, and are thus not settled. In order to remove the resulting measurement error, the initial sample(s) are discarded and not used for further processing with the ADC operations. As a result or removing the corrupted initial samples from system processing, the remaining key electrode scanning samples (e.g., $E0_{S3}$, $E0_{S4}$, $E0_{S5}$ and $E0_{S6}$) are treated as being independent of the electrode scan period $T_{SP}$ change since the electrode scan values are settled for an accurate measurement, and may be used for further processing to distinguish between electrode touch or release event.

Figure 4:
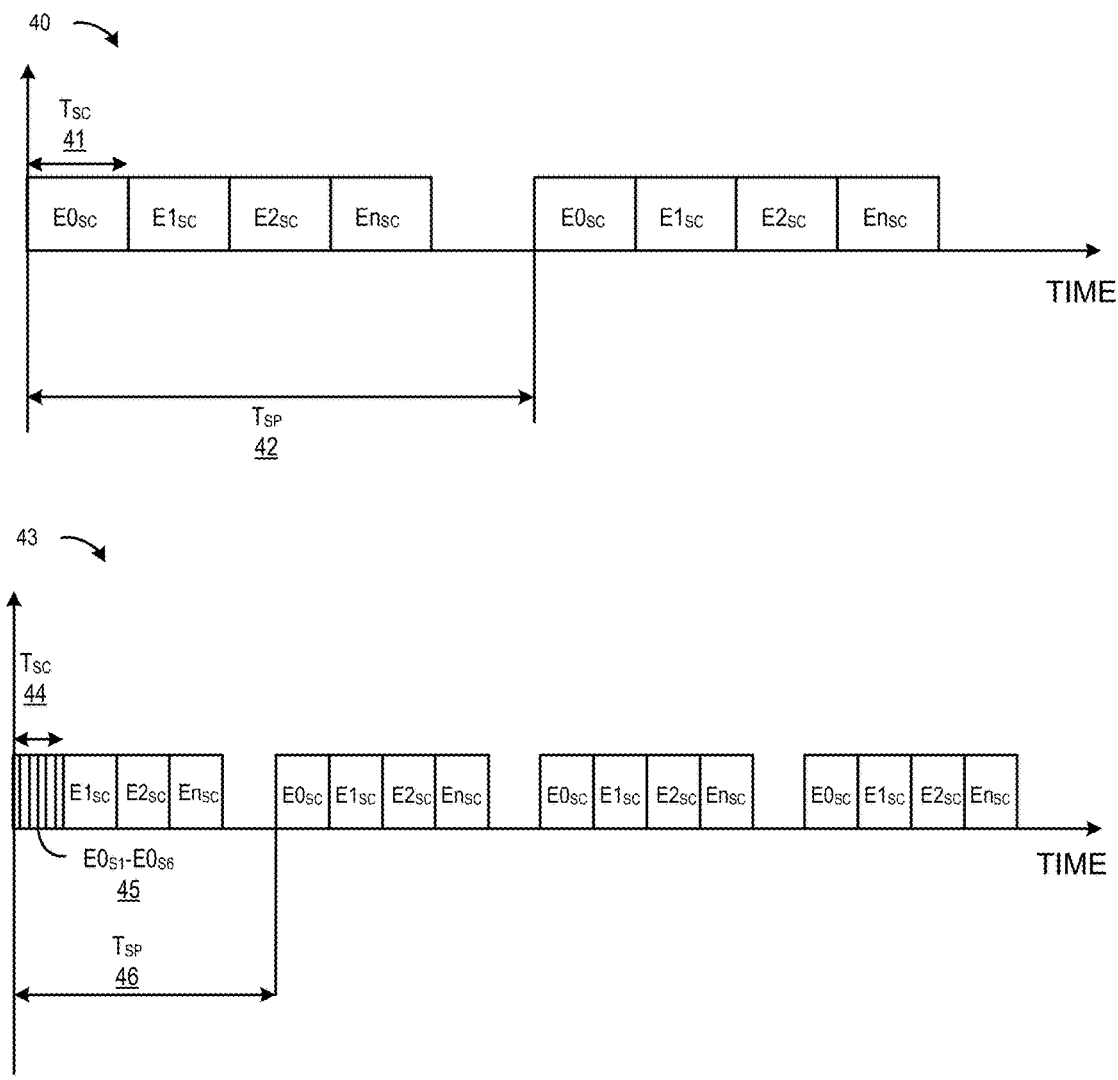
FIG. 4 depicts scan mode timing diagrams for multiple capacitive touch keypad electrodes on a capacitive touch button keypad in accordance with selected embodiments of the present disclosure.

While the electrode scanning techniques described herein may be applied with a single electrode, it will be appreciated that the scanning techniques may also be used with keypads having a plurality of "n" electrodes (e.g., E0-En), where "n" is an integer number. To illustrate how a similar procedure may be used to handle samples from multiple keypad electrodes, reference is now made to FIG. 4 which depicts scan mode timing diagrams 40, 43 for multiple capacitive touch keypad electrodes on a capacitive touch button keypad in accordance with selected embodiments of the present disclosure.

In a first scan mode shown with the first scan mode timing diagram 40, a plurality of "n" electrodes are sensed by sequentially scanning each of the touch electrodes E0-En with a sequence of sensing cycles that is periodically applied at a first, relatively low periodic key electrode scan rate (e.g., $T_{SP}$ 42) to detect any electrode touch or release events. In particular, each key electrode, from E0 to En, is scanned with a sequence of sensing cycles at a scan cycle ($T_{SC}$) 41, and the sequential scanning is repeated at a first periodic scanning interval $T_{SP}$ 42. Though not drawn to scale, the first scan mode may be used in a low power or sleep mode to monitor all of the touch electrodes E0-En for a touch or release event by configuring the first periodic scanning interval $T_{SP}$ 42 as a relatively large number (e.g., $T_{SP}$=50 ms) as compared to the second periodic scanning interval $T_{SP}$ 46, while the duration of the scan cycles ($T_{SC}$) 41 and 44 for the touch electrodes (e.g., E0) remains the same.

When prompted by the control signals, a faster scan mode is applied to the keypad as shown with the second timing diagram 43 where each of the "n" electrodes (e.g., E0) are sensed with multiple scan cycles 45 (e.g., $E0_{S1}$-$E0_{S6}$), but now at a faster rate where the touch electrodes E0-En are sequentially scanned at a second, relatively fast periodic key electrode scan rate (e.g., $T_{SP}$ 46) to detect any electrode touch or release events. In particular, each key electrode, from E0 to En, is scanned with a shorter scan cycle ($T_{SC}$) 44, each of which includes a plurality of repetitive scan cycles 45 (e.g., $E0_{S1}$-$E0_{S6}$), and the sequential scanning is repeated at a second periodic scanning interval $T_{SP}$ 46 that is shorter than the first periodic scanning interval $T_{SP}$ 42. Though not drawn to scale, the second scan mode may be used in a keypad scan mode to monitor all of the touch electrodes E0-En for a touch or release event by configuring the second periodic scanning interval $T_{SP}$ 46 as a relatively small number (e.g., $T_{SP}$=1 ms) as compared to the first periodic scanning interval $T_{SP}$ 42.

To compensate for measurement errors at the higher rate electrode scan cycles that can be induced by shifts in the scan rate, conventional systems have undertaken complex computations of electrode scan offset values that are added or subtracted from the measured electrode values, where the compensation offset values may be calculated on the basis of multiple factors, including the electrode scan rate value $T_{SP}$, one or more environment parameters (e.g., temperature, humidity), electrode manufacturing tolerances during mass production, and the like. Since one or more of these factors can change over time, such conventional systems need to be calibrated periodically (e.g., each second) to obtain an actual electrode scan offset value. In addition to the computational resources needed to compute the compensation offset values, there are also memory costs associated with storing compensation offset values in system memory, as well as power consumption costs associated with periodically calibrating and computing the compensation offset values. The complexity rises with fact, that only electrode scan samples, when electrode is not touched, can be used.

Figure 5:
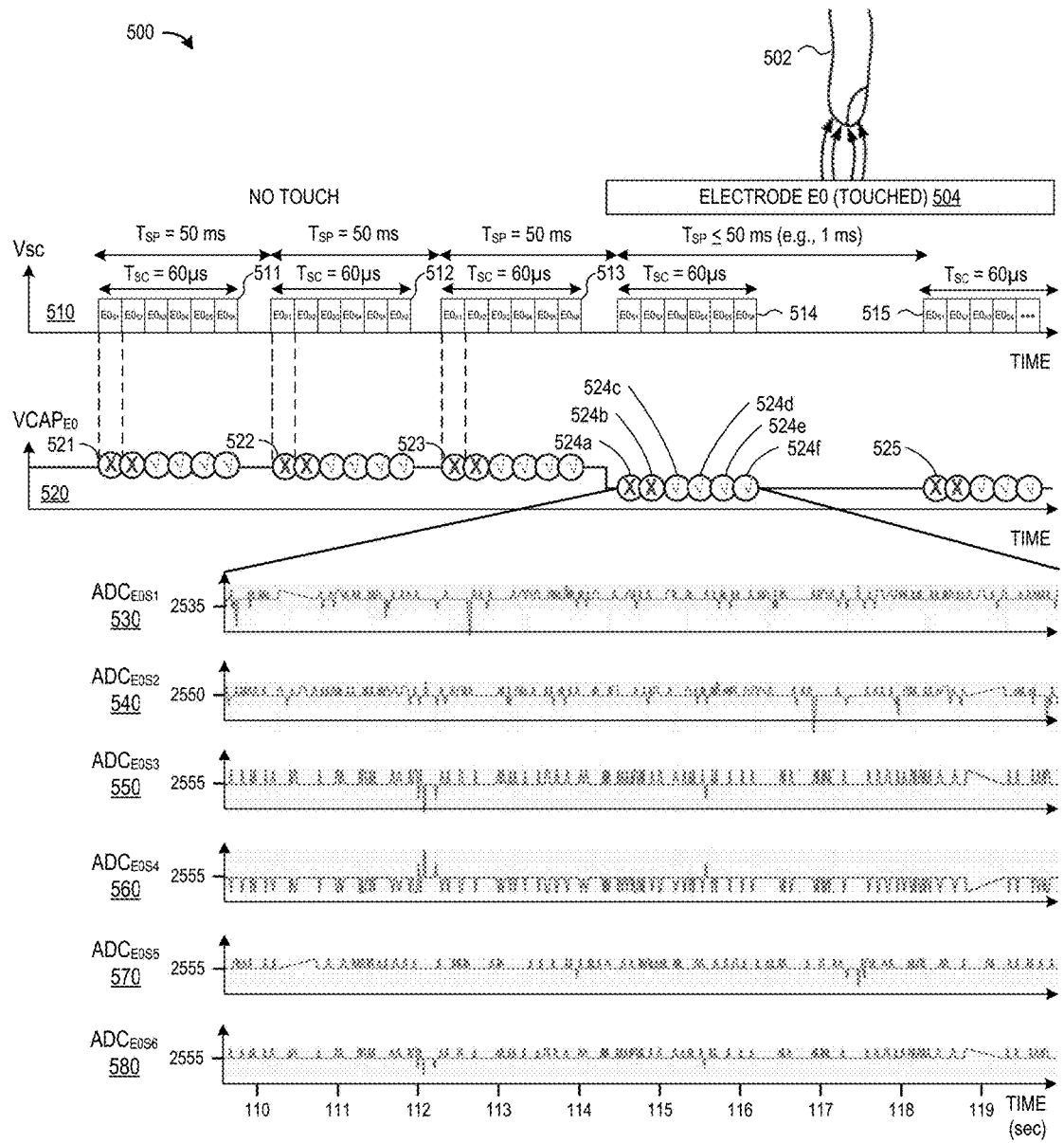
FIG. 5 graphically depicts output signal waveforms for a touch panel sensing electrode to illustrate how to reduce capacitive touch sense electrode sample errors when electrode scan rates are changed.

To illustrate how to reduce capacitive touch sense electrode sample value changes that can arise when the electrode scan rate changes without computing compensation offset values, reference is now made to FIG. 5 which graphically depicts signal waveforms 510-580 of an example timing sequence in which a touch panel sensing electrode (e.g., E0) is touched by an object 502 (e.g., a user's finger or stylus). As will be appreciated, the depicted scaling of the signal waveforms 510-580 are not drawn to scale, but are adjusted for purposes of illustrating the operation.

In the first signal waveform 510, there is shown a first plurality of scanning cycles 511-513 that are applied at a first predetermined cycling rate (e.g., every 50 milliseconds) and a second plurality of scanning cycles 514-515 that are applied at a second, faster predetermined cycling rate (e.g., every millisecond). As illustrated, the change in cycling rates can be promoted upon detecting that the keypad electrode E0 is touched, though the cycling rates can be changed for other reasons. Up until such time as the cycling rate changes, the scanning cycles 511-513 are applied with a first periodic scanning interval (e.g., $T_{SP}$=50 ms) to periodically scan the keypad electrode with multiple electrode sensing cycles (e.g., $E0_{S1}$-$E0_{S6}$), each having a scanning cycle $T_{SC}$ with a set duration (e.g., 10 μseconds). However, after the cycling rate changes, the scanning cycles 514-515 are applied with a second periodic scanning interval (e.g., $T_{SP}$≤50 ms) to periodically scan the keypad electrode with multiple electrode sensing cycles (e.g., $E0_{S1}$-$E0_{S6}$), each of which may have a scanning cycle $T_{SC}$ of the same duration (e.g., 10 μseconds) or a shorter duration. As depicted in the waveform 520, each of the electrode sensing cycles (e.g., $E0_{S1}$-$E0_{S6}$) in the first plurality of scanning cycles 511-513 is applied at a first periodic scanning interval (e.g., $T_{SP}$=50 ms), resulting in corresponding electrode sample events 521-523 for sampling the capacitive voltage 520 at the keypad electrode ($VCAP_{E0}$). However, once a keypad touch event is detected, the second plurality of scanning cycles (e.g., 514, 515) are applied to sequentially scan the keypad electrode with multiple electrode sensing cycles (e.g., $E0_{S1}$-$E0_{S6}$) at a different periodic scanning interval (e.g., $T_{SP}$≤50 ms), resulting in multiple electrode sample events 524, 525 for sampling the capacitive voltage 520 at the keypad electrode ($VCAP_{E0}$). For example, the multiple electrode sample event 524 includes a first sample cycle 524a, second sample cycle 524b, third sample cycle 524c, fourth sample cycle 524d, fifth sample cycle 524e, and sixth sample cycle 524f.

As the multiple sampled capacitive voltage values 524 for the keypad electrode E0 are converted to digital form (e.g., by the ADC), the resulting digital values from the initial samples (e.g., $E0_{S1}$, $E0_{S2}$) may include offset errors resulting from unsettled sample values when the scan rate has changed, though these offset errors disappear as the sample values settle. For example, as depicted in the waveform 530, the first sample cycle 524a from multiple electrode sample event 524 which corresponds to the first sample $E0_{S1}$ generates an ADC output value ($ADC_{E0S1}$) of approximately 2536 over time, while waveform 540 shows that the second sample cycle 524b from multiple electrode sample event 524 which corresponds to the first sample $E0_{S2}$ generates an ADC output value ($ADC_{E0S2}$) of approximately 2550 over time. However, the waveforms 550, 560, 570, 580 show that the sample cycles 524c-f which correspond to the settled samples (e.g., $E0_{S3}$-$E0_{S6}$) generate ADC output values ($ADC_{E0S3}$-$ADC_{E0S6}$) of approximately 2555 over time which do not include offset errors.

As seen from the foregoing, the ADC output waveforms 530, 540 reflect the offset errors captured from the initial samples (e.g., $E0_{S1}$, $E0_{S2}$), but the other ADC output waveforms 550-580 captured from the remaining settled samples (e.g., $E0_{S3}$-$E0_{S6}$) do not contain offset errors, and instead track to the correct digital result (e.g., 2555). With this dynamic in mind, the erroneous electrode scan values may be selectively sorted, discarded and/or removed from the collected samples 524, as indicated by the "x" marks with the first and second sample cycles 524a, 524b, leaving only the stable samples 524c-f for ADC sampling, as indicated by the "√" marks. As a result, an efficient software-based solution can replace the complex computational approach for computing compensation offset values, thereby conserving computational resources and memory storage while reducing power consumption. Another advantage of the selective sample discard approach is that it can be used in connection with either touch or release events to initiate repetitive scanning and select samples with settled values, thereby providing a sensing solution that is independent of changes in the electrode scan rate. Yet another advantage of the disclosed selective sample discard approach is that the system must only be calibrated once after power-up and/or restart since periodic recalibrations are not required.

Figure 6:
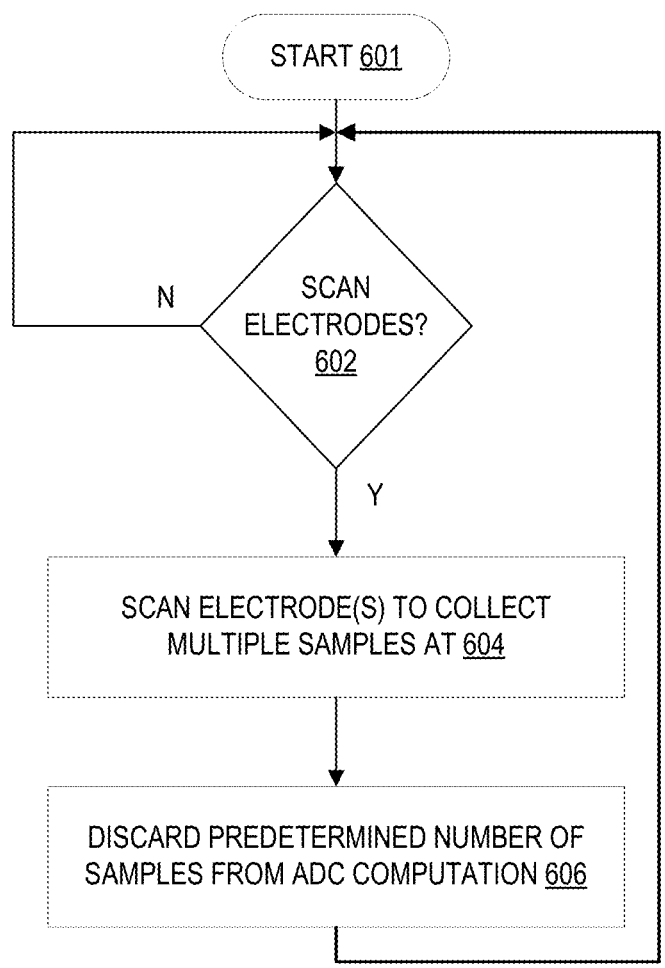
FIG. 6 illustrates simplified flow chart showing the logic for reducing capacitive touch sense electrode sample errors when electrode scan rates are changed by discarding a predetermined number of samples from the ADC computations in accordance with selected embodiments of the present disclosure.

To provide additional details for an improved understanding of selected embodiments of the present disclosure, reference is now made to FIG. 6 which depicts a simplified flow chart 600 showing the logic for reducing capacitive touch sense electrode sample errors when electrode scan rates are changed by discarding a predetermined number of samples from the ADC computations in accordance selected embodiments of the present disclosure. In an example embodiment, the control logic and methodology shown in FIG. 6 may be implemented as hardware and/or software on a host computing system, processor, or microcontroller unit that includes processor and memory for storing programming control code for performing the capacitive touch sense unit functionality described herein.

After starting (step 601), the process periodically scans one or more electrodes (step 602), such as by entering a low power or sleep mode wherein the keypad electrode(s) are periodically checked to detect a touch or release event. As will be appreciated, the electrode scanning may be initiated to collect baseline reference voltage measurements over a plurality of periodic scanning cycles for use in evaluating whether a touch or release event has occurred at the keypad electrode(s). In addition, the electrode scanning may be initiated when there is a change in the scanning rate, such as when an electrode is touched or released, or upon detection of an object proximity event, and/or by some other operational requirement to improve system performance. Once electrode scanning begins (affirmative outcome to detection step 602), then the electrode(s) are scanned to collect multiple electrode samples for each electrode (step 604). To account for situations where a change in the scan rate may result in the initial samples conveying two different voltages for the same electrode capacitance, a predetermined number of samples (e.g. 1 or 2) are discarded from the ADC computation (step 606) before reverting back to step 602 to periodically check the keypad electrode(s) for the next electrode scan event.

Figure 7:
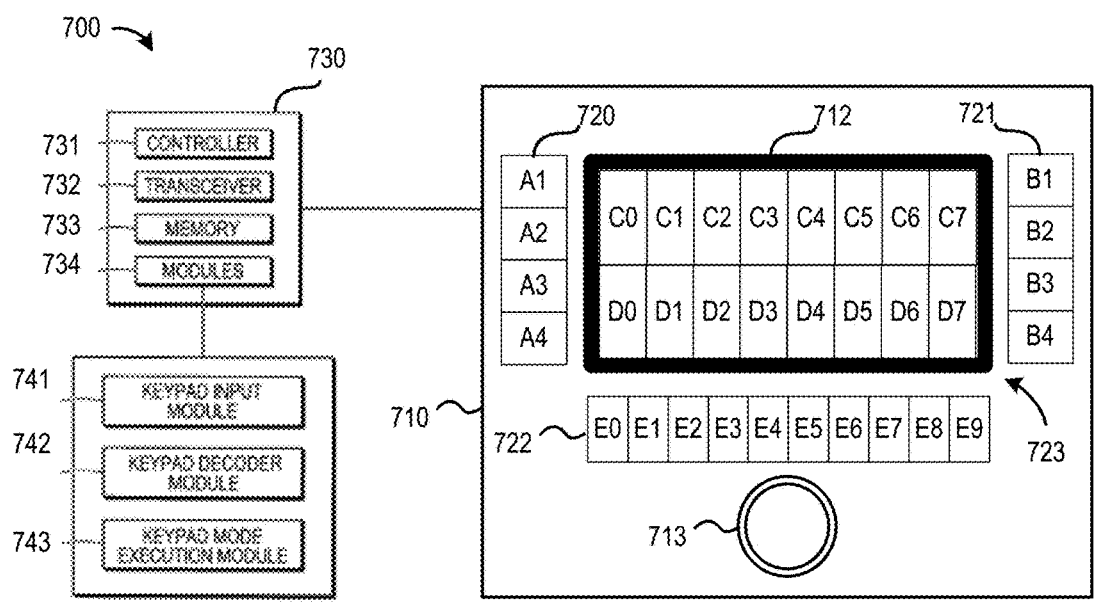
FIG. 7 shows a simplified schematic block diagram of a capacitive touch sensing keypad system in accordance with selected embodiments of the present disclosure.

To provide a contextual understanding for selected embodiments of the present disclosure, reference is now made to FIG. 7 which shows a simplified schematic block diagram of a capacitive touch sensing keypad system 700 in accordance with selected embodiments of the present disclosure. While the keypad system 700 may be implemented in any of a variety of automotive applications, such as a HVAC or radio control panel, overhead console, or the like, the capacitive touch sensing keypad system 700 represents a wide variety of electronic devices, such as mobile communication devices, appliances, point of sale, medical and industrial applications using touch panels and touch screens, including but not limited to portable media devices, MP3 players, mobile phones, messaging devices, personal digital assistants (PDAs), notebook or laptop computers incorporating communication modems, mobile data terminals, application specific gaming devices, video gaming devices incorporating wireless modems, or any other type of electronic device having a keyboard-based input which uses capacitive, proximity or electric field sensors.

As depicted, the device 700 includes a display casing 710 for assembling a display screen 712, one or more control buttons 713 (e.g., menu or cursor button or dial), and a plurality of touch sensitive keypads 720-723, the operative functionality is controlled by internal software modules and hardware circuits 730. The depicted touch sensitive keypads 720-723 include a first plurality of plurality of capacitive key electrodes A1-A4 720, a second plurality of plurality of capacitive key electrodes B1-B4 721, and a third plurality of capacitive key electrodes E0-E9 722 which are shown as being arranged on different sides of the display screen 712 which may also include a plurality of designated screen capacitive key electrodes C0-C6, D0-D7 723 arranged in rows across the display screen 712. As will be appreciated, each of the capacitive key electrodes 720-723 may be arranged in any desired configuration, such as a linear array, a numeric keypad, a QWERTY keypad and/or may include fewer or more keys than shown. However arranged, each of the touch sensitive capacitive key electrodes 720-723 is electronically coupled to provide user input to the internal circuit/modules 730 which include a controller or processor 731, transceiver 732, memory 733, and modules 734. The controller 731 is configured to receive user input from each of the touch sensitive capacitive key electrodes 720-723 to specify or execute particular functions of the device.

The modules 734 can include a keypad input receiving module 741 for receiving user input to a keypad of the electronic device, and a keypad decode module 742 for demultiplexing and decoding the detected output from each of the capacitive key electrodes 720-723, and a keypad function executing module 743 for executing a function of a mode for keypad input of the electronic device 700 according to the user input to the capacitive key electrodes 720-723. The modules 734 and others can carry out certain processes of the methods as described herein, and may be implemented in software, such as in the form of one or more sets of pre-stored instructions, and/or hardware, which can facilitate the operation of the mobile station or electronic device as discussed below. The modules 734 may be installed at the factory or can be installed after distribution by, for example, a downloading operation.

By now it should be appreciated that there has been provided a capacitive sensor apparatus, method, program code, and system for detecting keypad touch events. In the disclosed embodiments, the system includes an analog-to-digital converter (ADC) and a capacitive sensor device having a capacitive touch sense electrode coupled to measure capacitance voltages at the capacitive touch sense electrode using a configurable electrode scan rate. In selected embodiments, the capacitive sensor device may include a first capacitor comprising the capacitive touch sense electrode; a first supply voltage; a first switch operable to couple the capacitive touch sense electrode to the first supply voltage during a first mode and the ADC during a second mode; a second capacitor; a second supply voltage different than the first supply voltage; a second switch operable to couple the second capacitor to the second supply voltage during the first mode and to an open circuit during the second mode; and a resistive element including a first terminal coupled between the first capacitor and the first switch, and a second terminal coupled between the second capacitor and the second switch. In addition or in the alternative, the capacitive sensor device may include a multi-key capacitive touch keypad, each key comprising an electrode that is coupled to measure capacitance voltages using the configurable electrode scan rate. The disclosed system also includes a controller configured to selectively sample capacitance voltage measurements at the capacitive touch sense electrode with the analog-to-digital converter when there is a change in the configurable electrode scan rate by repetitively sampling a first plurality of capacitance voltage measurements from the capacitive touch sense electrode over a plurality of sequential electrode scan cycles and then discarding a predetermined number of the first plurality of capacitance voltage measurements to generate a second plurality of capacitance voltage measurements from the analog-to-digital converter. For example, the controller may be configured to discard two initial capacitance voltage measurements from the first plurality of capacitance voltage measurements. In selected embodiments, the capacitive sensor device may be connected to measure capacitance voltages at the capacitive touch sense electrode with a first relatively slow electrode scan rate during a low power mode, and may also be connected to measure capacitance voltages at the capacitive touch sense electrode with a second relatively fast electrode scan rate during a keypad scan mode. For example, the controller may be configured to selectively sample capacitance voltage measurements at the capacitive touch sense electrode by repetitively sampling the first plurality of capacitance voltage measurements with a sampling sequence that is periodically applied at the first relatively slow electrode scan rate and discarding at least a first pair of capacitive voltage measurements from the first plurality of capacitance voltage measurements generated by the analog-to-digital converter. In addition, the controller may be configured to selectively sample capacitance voltage measurements at the capacitive touch sense electrode by repetitively sampling the first plurality of capacitance voltage measurements with a sampling sequence that is periodically applied at the second, relatively fast electrode scan rate and discarding at least a first pair of capacitive voltage measurements from the first plurality of capacitance voltage measurements generated by the analog-to-digital converter.

In another form, there is provided a method and apparatus for operating a capacitive sensor system. In the disclosed method, a first plurality of capacitance voltage measurements from a capacitive touch sense electrode are repetitively sampled at an analog-to-digital converter by applying a plurality of sequential electrode scan cycles to the capacitive touch sense electrode. In selected embodiments, the repetitive sampling the first plurality of capacitance voltage measurements is performed by connecting the capacitive touch sense electrode to the analog-to-digital converter to measure capacitance voltages with a first relatively slow electrode scan rate during a low power mode, and connecting the capacitive touch sense electrode to the analog-to-digital converter to measure capacitance voltages with a second relatively fast electrode scan rate during a keypad scan mode. In other embodiments, the repetitive sampling is performed by controlling a first switch to couple a first supply voltage to the capacitive touch sense electrode during a first mode and to couple the capacitive touch sense electrode to the analog-to-digital converter during a second mode; controlling a second switch to couple a second capacitor to a second supply voltage during the first mode and to the analog-to-digital converter during the second mode, wherein a resistive element includes a first terminal coupled between the capacitive touch sense electrode and the first switch, and a second terminal coupled between the second capacitor and the second switch, wherein a microcontroller comprising the analog-to-digital converter further includes a first communication port coupled to an output of the first switch and a second communication port coupled to an output of the second switch, and wherein the capacitive touch sense electrode and second capacitor are external to the analog-to-digital converter. After repetitively sampling, a predetermined number of the first plurality of capacitance voltage measurements from the analog-to-digital converter are discarded to generate a second plurality of capacitance voltage measurements when there is a change in a configurable electrode scan rate used to measure a capacitance voltage at the capacitive touch sense. In selected embodiments, the discarding step is performed by selecting the second plurality of capacitance voltage measurements from the capacitive touch sense electrode which have settled capacitance voltage measurements. In other embodiments, the discarding step is performed by discarding at least a first pair of capacitive voltage measurements from the first plurality of capacitive voltage measurements measured by the analog-to-digital converter with the first relatively slow electrode scan rate. In other embodiments, the discarding step is performed by discarding at least a first pair of capacitive voltage measurements from the first plurality of capacitive voltage measurements measured by the analog-to-digital converter with the second, relatively fast electrode scan rate.

In yet another form, there is provided an electronic device and associated method operation. As disclosed, the electronic device includes a keypad having a plurality of key electrodes. The electronic device also includes an analog-to-digital converter (ADC) connected to each of the plurality of key electrodes over a switching circuit. In addition, the electronic device includes a controller connected to the switching circuit and configured to operate the keypad by periodically scanning each key electrode with a configurable electrode scan rate to selectively sample capacitance voltage measurements at each key electrode with the analog-to-digital converter when there is a change in the configurable electrode scan rate by repetitively sampling a first plurality of capacitance voltage measurements from each keypad electrode over a plurality of sequential electrode scan cycles and then discarding a predetermined number of the first plurality of capacitance voltage measurements to generate a second plurality of capacitance voltage measurements from the analog-to-digital converter for each keypad electrode. In selected embodiments, each key electrode is connected to measure capacitance voltages with repetitively sampling of the first plurality of capacitance voltage measurements that is periodically applied with a first relatively slow electrode scan rate during a low power mode, and is connected to measure capacitance voltages with repetitive sampling of the first plurality of capacitive voltage measurements that is periodically applied with a second relatively fast electrode scan rate during a keypad scan mode. In such embodiments, the controller may be configured to selectively sample capacitance voltage measurements at each key electrode by repetitively sampling the first plurality of capacitance voltage measurements with a sampling sequence that is periodically applied at the first relatively slow electrode scan rate and discarding at least a first pair of capacitive voltage measurements from the first plurality of capacitive voltage measurements generated by the analog-to-digital converter. In addition, the controller may be configured to selectively sample capacitance voltage measurements at each key electrode by repetitively sampling the first plurality of capacitance voltage measurements with a sampling sequence that is periodically applied at the second, relatively fast electrode scan rate and discarding at least a first pair of capacitive voltage measurements from the first plurality of capacitive voltage measurements generated by the analog-to-digital converter. For example, the controller may be configured to discard two initial capacitance voltage measurements from the first plurality of capacitance voltage measurements measured at each key electrode. Alternatively, the controller may be configured to discard the predetermined number of the first plurality of capacitance voltage measurements by selecting the second plurality of capacitance voltage measurements from each key electrode which have settled capacitance voltage measurements.

Although the described exemplary embodiments disclosed herein for an enhanced capacitive keypad design are described with reference to various implementation details for automotive applications, the present invention is not necessarily limited to the example embodiments illustrate herein. For example, various embodiments may be implemented in industrial equipment or home appliance using a touch panel, point of sales with touch screen, portable electronics as cell phones or MP3 players, medical equipment and almost any device using touch panels or keypad touch screens. The methods and systems for enhancing the design of a capacitive keypad as shown and described herein may be implemented using a variety of different electrode shapes and geometries wherein predetermined samples from a sequential collection of repetitive scan samples are discarded or removed from the ADC processing so that scanning rate changes do not create capacitor voltage measurement errors from the discarded samples. The enhanced design of the electrode shape and layout also saves costs by reducing computational complexity, periodic calibration requirements, memory storage, and power consumption. In addition, the enhanced design allows touch and release events to be accurately detected, independently of the scan rate, changing operating conditions, and process variations by selectively discarding the initial sample(s) from a sequential collection of repetitive scan samples collected over time. Thus, the particular embodiments disclosed above are illustrative only and should not be taken as limitations upon the present invention, as the invention may be modified and practiced in different but equivalent manners apparent to those skilled in the art having the benefit of the teachings herein. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Various illustrative embodiments of the present invention have been described in detail with reference to the accompanying figures. While various details are set forth in the foregoing description, it will be appreciated that the present invention may be practiced without these specific details, and that numerous implementation-specific decisions may be made to the invention described herein to achieve the circuit designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are shown in block diagram form, rather than in detail, in order to avoid limiting or obscuring the present invention. In addition, some portions of the detailed descriptions provided herein are presented in terms of algorithms or operations on data within a computer memory. Such descriptions and representations are used by those skilled in the art to describe and convey the substance of their work to others skilled in the art.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A capacitive sensor system, comprising:
   an analog-to-digital converter (ADC);
   a capacitive sensor device comprising:
      a first capacitor comprising a capacitive touch sense electrode coupled to measure capacitance voltages at the capacitive touch sense electrode using a configurable electrode scan rate;
      a first supply voltage;
      a first switch operable to couple the capacitive touch sense electrode to the first supply voltage during a first mode and the ADC during a second mode;
      a second capacitor;
      a second supply voltage different than the first supply voltage;
      a second switch operable to couple the second capacitor to the second supply voltage during the first mode and to an open circuit during the second mode;
      a resistive element including a first terminal coupled between the first capacitor and the first switch, and a second terminal coupled between the second capacitor and the second switch; and
   a controller configured to selectively sample capacitance voltage measurements at the capacitive touch sense electrode with the analog-to-digital converter when there is a change in the configurable electrode scan rate by repetitively sampling a first plurality of capacitance voltage measurements from the capacitive touch sense electrode over a plurality of sequential electrode scan cycles and then discarding a predetermined number of the first plurality of capacitance voltage measurements to generate a second plurality of capacitance voltage measurements from the analog-to-digital converter.

2. The capacitive sensor system of claim 1, where the capacitive sensor device comprises a multi-key capacitive touch keypad, each key comprising an electrode that is coupled to measure capacitance voltages using the configurable electrode scan rate.

3. The capacitive sensor system of claim 1, where the capacitive sensor device is connected to measure capacitance voltages at the capacitive touch sense electrode with a first relatively slow electrode scan rate during a low power mode, and is connected to measure capacitance voltages at the capacitive touch sense electrode with a second relatively fast electrode scan rate during a keypad scan mode.

4. The capacitive sensor system of claim 3, where the controller is configured to selectively sample capacitance voltage measurements at the capacitive touch sense electrode by repetitively sampling the first plurality of capacitance voltage measurements with a sampling sequence that is periodically applied at the first relatively slow electrode scan rate and discarding at least a first pair of capacitive voltage measurements from the first plurality of capacitive voltage measurements generated by the analog-to-digital converter.

5. The capacitive sensor system of claim 3, where the controller is configured to selectively sample capacitance voltage measurements at the capacitive touch sense electrode by repetitively sampling the first plurality of capacitance voltage measurements with a sampling sequence that is periodically applied at the second, relatively fast electrode scan rate and discarding at least a first pair of capacitive voltage measurements from the first plurality of capacitive voltage measurements generated by the analog-to-digital converter.

6. The capacitive sensor system of claim 1, where the controller is configured to discard two initial capacitance voltage measurements from the first plurality of capacitance voltage measurements.

7. A method of operating a capacitive sensor system, comprising:
   repetitively sampling a first plurality of capacitance voltage measurements from a capacitive touch sense electrode using an analog-to-digital converter which applies a plurality of sequential electrode scan cycles to the capacitive touch sense electrode;
   where repetitively sampling the first plurality of capacitance voltage measurements comprises:
      controlling a first switch to couple a first supply voltage to the capacitive touch sense electrode during a first mode and to couple the capacitive touch sense electrode to the analog-to-digital converter during a second mode;
      controlling a second switch to couple a second capacitor to a second supply voltage during the first mode and to the analog-to-digital converter during the second mode,
      wherein a resistive element includes a first terminal coupled between the capacitive touch sense electrode and the first switch, and a second terminal coupled between the second capacitor and the second switch,
      wherein a microcontroller comprising the analog-to-digital converter further includes a first communication port coupled to an output of the first switch and a second communication port coupled to an output of the second switch, and
      wherein the capacitive touch sense electrode and second capacitor are external to the analog-to-digital converter; and
   discarding a predetermined number of the first plurality of capacitance voltage measurements from the analog-to-digital converter to generate a second plurality of capacitance voltage measurements when there is a change in a configurable electrode scan rate used to measure a capacitance voltage at the capacitive touch sense electrode.

8. The method of claim 7, where discarding the predetermined number of the first plurality of capacitance voltage measurements comprises selecting the second plurality of capacitance voltage measurements from the capacitive touch sense electrode which have settled capacitance voltage measurements.

9. The method of claim 7, where repetitively sampling the first plurality of capacitance voltage measurements comprises repetitively sampling capacitance voltage measurements at each key electrode in a multi-key capacitive touch keypad using a configurable electrode scan rate.

10. The method of claim 7, where repetitively sampling the first plurality of capacitance voltage measurements comprises connecting the capacitive touch sense electrode to the analog-to-digital converter to measure capacitance voltages with a first relatively slow electrode scan rate during a low power mode, and connecting the capacitive touch sense electrode to the analog-to-digital converter to measure capacitance voltages with a second relatively fast electrode scan rate during a keypad scan mode.

11. The method of claim 10, where the discarding the predetermined number of the first plurality of capacitance voltage measurements comprises discarding at least a first pair of capacitive voltage measurements from the first plurality of capacitive voltage measurements measured by the analog-to-digital converter with the first relatively slow electrode scan rate.

12. The method of claim 10, where the discarding the predetermined number of the first plurality of capacitance voltage measurements comprises discarding at least a first pair of capacitive voltage measurements from the first plurality of capacitive voltage measurements measured by the analog-to-digital converter with the second, relatively fast electrode scan rate.

13. An electronic device, comprising:
    a keypad comprising a plurality of key electrodes;
    an analog-to-digital converter (ADC) connected to each of the plurality of key electrodes over a switching circuit; and
    a controller connected to the switching circuit and configured to operate the keypad by periodically scanning each key electrode with a configurable electrode scan rate to selectively sample capacitance voltage measurements at each key electrode with the analog-to-digital converter when there is a change in the configurable electrode scan rate by repetitively sampling a first plurality of capacitance voltage measurements from each keypad electrode over a plurality of sequential electrode scan cycles and then discarding a predetermined number of the first plurality of capacitance voltage measurements to generate a second plurality of capacitance voltage measurements from the analog-to-digital converter for each keypad electrode;
    a capacitive sensor device comprising:
        a first capacitor comprising a first key electrode of the plurality of key electrodes;
        a first supply voltage;
        a first switch operable to couple the first key electrode to the first supply voltage during a first mode and the ADC during a second mode;
        a second capacitor;
        a second supply voltage different than the first supply voltage;
        a second switch operable to couple the second capacitor to the second supply voltage during the first mode and to an open circuit during the second mode;
        a resistive element including a first terminal coupled between the first capacitor and the first switch, and a second terminal coupled between the second capacitor and the second switch.

14. The electronic device of claim 13, where each key electrode is connected to measure capacitance voltages with repetitively sampling of the first plurality of capacitance voltage measurements that is periodically applied with a first relatively slow electrode scan rate during a low power mode, and is connected to measure capacitance voltages with repetitive sampling of the first plurality of capacitive voltage measurements that is periodically applied with a second relatively fast electrode scan rate during a keypad scan mode.

15. The electronic device of claim 14, where the controller is configured to selectively sample capacitance voltage measurements at each key electrode by repetitively sampling the first plurality of capacitance voltage measurements with a sampling sequence that is periodically applied at the first relatively slow electrode scan rate and discarding at least a first pair of capacitive voltage measurements from the first plurality of capacitive voltage measurements generated by the analog-to-digital converter.

16. The electronic device of claim 14, where the controller is configured to selectively sample capacitance voltage measurements at each key electrode by repetitively sampling the first plurality of capacitance voltage measurements with a sampling sequence that is periodically applied at the second, relatively fast electrode scan rate and discarding at least a first pair of capacitive voltage measurements from the first plurality of capacitive voltage measurements generated by the analog-to-digital converter.

17. The electronic device of claim 13, where the controller is configured to discard two initial capacitance voltage measurements from the first plurality of capacitance voltage measurements measured at each key electrode.

18. The electronic device of claim 13, where the controller is configured to discard the predetermined number of the first plurality of capacitance voltage measurements by selecting the second plurality of capacitance voltage measurements from each key electrode which have settled capacitance voltage measurements.

* * * * *